United States Patent [19]
Romano et al.

[11] Patent Number: 5,111,049
[45] Date of Patent: May 5, 1992

[54] REMOTE FIRED RF GETTER FOR USE IN METAL INFRARED DETECTOR DEWAR

[75] Inventors: Timothy S. Romano; Leonard E. Peck, Jr., both of Goleta; Karl H. Neumann, Santa Barbara; Robert E. Zahuta, Lompoc, all of Calif.

[73] Assignee: Santa Barbara Research Center, Goleta, Calif.

[21] Appl. No.: 631,556

[22] Filed: Dec. 21, 1990

[51] Int. Cl.⁵ ............................................. G12B 15/00
[52] U.S. Cl. ...................................................... 250/352
[58] Field of Search ........................................ 250/352

[56] References Cited

U.S. PATENT DOCUMENTS

| | | | |
|---|---|---|---|
| 4,206,354 | 6/1980 | Small, Jr. | 250/349 |
| 4,297,082 | 10/1981 | Wurtz et al. | 417/51 |
| 4,474,036 | 10/1984 | Ball et al. | 62/51.1 |
| 4,510,758 | 4/1985 | Tench, Jr. | 62/45.1 |
| 5,012,102 | 4/1991 | Gowlett | 250/352 |

Primary Examiner—Constantine Hannaher
Attorney, Agent, or Firm—W. C. Schubert; W. K. Denson-Low

[57] ABSTRACT

An infrared detector assembly (10) of the type used in munition and night vision systems having an RF activated getter (50). Such detector assemblies (10) include a tubular coldfinger (22) surrounded by a vacuum and which supports infrared detector array (26) and related components. In accordance with this invention, RF getter (50) is located remote from detector array (26) and engages an inner wall surface (56) of a metallic dewar housing (14). The RF getter (50) is activated via RF inductive heating directly through the metal dewar housing (14) such that sensitive IR detector components and hermetic braze joints are kept below their critical temperature. As a result, the present invention provides longer vacuum life and greater operational reliability of infrared detector assembly (10).

16 Claims, 2 Drawing Sheets

REMOTE FIRED RF GETTER FOR USE IN METAL INFRARED DETECTOR DEWAR

BACKGROUND OF THE INVENTION

1. Technical Field

The present invention relates to hermetically sealed packages and, more particularly, to dewars containing infrared detectors.

2. Discussion

Infrared detection systems are often used in conjunction with munition and night vision systems for sensing electromagnetic radiation in the wavelength range of 1 to 15 micrometers. Most infrared detection systems employ sensors, such as mercury-cadmium-telluride detectors, which are most sensitive when operating at approximately 77K. Therefore, a cryogenic cooling system is required to produce and maintain the required low operating temperatures. Typically, such cooling systems either take the form of a cryostat operating using the Joule Thompson effect or a Stirling cycle cryoengine.

The cooling system is used in conjunction with an evacuated dewar in which the detector is placed. Evacuation of the dewar is required to remove thermally conductive gases which would otherwise occupy the vacuum space surrounding the detector so that potential heat loss through convection and conduction during cryogenic operation is minimized. The evacuated dewar also inhibits moisture from condensing on the detector. The infrared detector is typically cooled by placing an indented region ("coldwell") of the dewar in contact with an expansion chamber ("coldfinger") of the cryogenic cooling system. The coldfinger is a tubular member having an end ("cold end") which is cooled and which supports the detector and its related readout components. During operation, the cryogenic cooling system expands a fluid, such as helium, in the coldfinger near the coldend which, in turn, absorbs thermal energy for cooling the detector.

While traditional evacuated dewars have generally operated satisfactorily, they do have some design constraints which detrimentally effect their manufacturability and reliability. For example, the choice of materials that can be used to fabricate the various components of the dewar are somewhat limited and expensive since it is necessary to choose materials having special characteristics such as low diffusivity, low out-gassing and other properties. Furthermore, implementing the necessary closure techniques (i.e., hermetic welding and brazing) required to create the vacuum inside the dewar is often costly and unreliable in that it is difficult to ensure that vacuum integrity is maintained over a long period of time. It is known that a prime cause of detector failure is the gradual degradation of vacuum integrity in the dewar due to internal out-gassing from the various components surrounding the detector which are also exposed to the vacuum environment. Such vacuum degradation eventually leads to a condition in which the cooling system is no longer able to effectively cool the detector to the desired temperature within the desired time period for sensitive detection of incoming infrared radiation. Thus, a primary design criteria for most infrared detection systems, is an extended "shelf-life" of the vacuum within the dewar assembly.

In order to reduce internal out-gassing, it is known to provide at least one getter in the vacuum space for gettering gas molecules therefrom. Conventionally, most infrared detector assemblies use electrically activated or "wire-heated" getters which require vacuum feedthrough pins protruding through the dewar housing into the vacuum space surrounding the detector. Numerous manufacturing operations are required to assemble and hermetically seal the wire-heated getters in conventional detector assemblies. Thereafter, the wire-heated getters are activated by being taken to a very high temperature in the range of about 900° to 1000° C. following evacuation and hermetic closure processing of the detector assembly. As such, costly internal shielding is required to protect the sensitive detector components, welds and brazed joints from the extremely high getter activation temperatures associated with wire-heated getters. Similarly, since the wire-heated getters require specific placement in the dewar, fewer getters can be used which results in less gas capacity and, in turn, a shorter vacuum life. Furthermore, an increased risk of vacuum failure is associated with dewars having wire-heated getters due to loss of hermeticity at the getter feedthroughs. These drawbacks result in less dewar reliability and higher manufacturing and scrap costs associated with fabrication of conventional "wire-heated" infrared dewar assemblies. In addition, wire-heated getters are susceptible to failure due to environmental stresses acting on the wire connections which can break or be electrically shorted during operation.

SUMMARY OF THE INVENTION

In accordance with the teachings of the preferred embodiment of this invention, an infrared detector assembly is disclosed having an RF activated getter incorporated therein and methods of manufacturing and activating the same. The RF getter is activated via RF inductive heating directly through the metal dewar housing such that sensitive IR detector components and hermetic braze joints are kept below their critical temperatures. The RF getter is positioned within the dewar intermediate the coldfinger and the outer dewar housing so as to eliminate getter feedthrough pins and permit substantially more getter material to be placed within the detector assembly. As a result, the present invention provides longer vacuum life (i.e. shelf-life), less risk of premature vacuum failure, greater operational reliability and lower manufacturing and assembly costs. Furthermore, the increased reliability and decreased failure potential results in a more rugged dewar design that is capable of withstanding greater environmental stresses.

BRIEF DESCRIPTION OF THE DRAWINGS

Various advantages of the invention will become apparent to one skilled in the art after reading the following specification and by reference to the drawings, in which.

DETAILED DESCRIPTION OF THE PREFERRED EMBODIMENT

Figure 1:
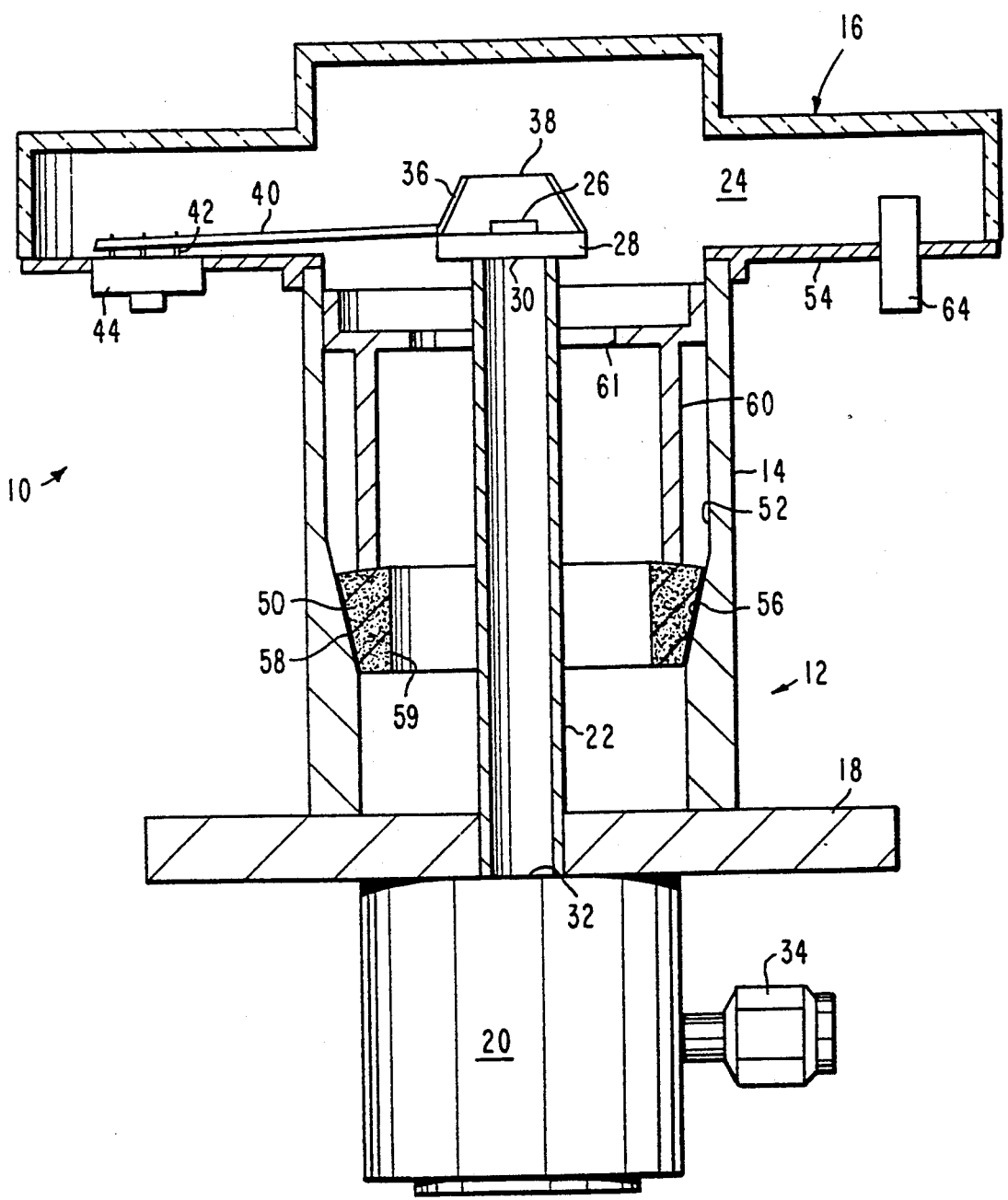
FIG. 1 is a cross-sectional view of an infrared detector assembly made in accordance with the teachings of the preferred embodiment of this invention.

Conventionally, getters capable of radio frequency ("RF") inductive heating activation have only been used with non-metallic (i.e., glass) dewar systems and, as such, have not typically been associated with infrared detector assemblies. Such limited application is directly related to the extreme difficulty in activating RF getters housed within metallic dewars without destroying sensitive infrared detector components. Therefore, according to the teachings of the present invention, a low-cost infrared detector assembly is disclosed having an RF activated getter which is totally enclosed within a metallic dewar housing. The RF getter is installed within the infrared detector assembly prior to hermetic closure and evacuation processing so as to eliminate the previously mentioned disadvantages associated with the use of prior art wire-heated getters.

It should be understood that the drawings are not to scale and the relative dimensions and proportions may be exaggerated or reduced for the sake of clarity and convenience. Furthermore, various parts of the detector assembly which are not necessary for describing or understanding the principles of the present invention are not shown but may be provided in a known manner.

With reference to the drawings, an infrared detector assembly is shown to include a vacuum assembly 12 having a metallic dewar housing 14 with a window assembly 16 mounted at one end thereof and a lower mounting flange 18 secured at an opposite end thereof. Mounting flange 18 is adapted for connection to a suitable cooling system such as cryoengine 20. Cryoengine 20 is coupled to a coldfinger 22 which projects upwardly through dewar housing 14 and into window assembly 16. Vacuum assembly 12 is a hermetic chamber which defines a vacuum space 24 therein. An infrared detector 26 is mounted on an end-cap or focal plane platform 28 which is, in turn, mounted to an end of a coldfinger 22. Preferably, coldfinger 22 is a hollow right circular cylindrical tube fabricated from a low thermal conductivity material and which defines a cold end 30 and a warm end 32, (referring to their relative temperatures during use).

Cryoengine 20 communicates with a remote source (not shown) of a suitable cryogenic fluid via fluid inlet 34 and is installed in association with coldfinger 22 to produce the required cryogenic temperatures at cold end 30. Expansion of the cryogenic fluid inside coldfinger 22 causes thermal energy to be withdrawn from end-cap 28 and, in turn, detector 26 thereby cooling detector 26. A coldshield 36 is mounted to end-cap 28 and surrounds detector 26. Coldshield 36 includes an aperture 38 in an upper portion thereof which acts as a field-stop for restricting the field of view of detector 26 in a known manner. It is contemplated that any electromagnetic detector, such as a mercury-cadmium-telluride array, or a hybrid thereof, capable of receiving infrared radiation and generating a responsive electrical signal can be readily used with the present invention.

A cable 40 is provided to electrically interconnecting detector 26 to pins 42 of a hermetically sealed input/output connector 44. Pins 42 extend vertically through connector 44 and provide a means for electrically interconnecting cable 40 with external processor electronics (not shown). It will be appreciated that other suitable means for electrically interfacing detector 26 to remote electronics can be readily substituted for cable 40.

At least one getter 50 is provided to absorb any outgasses which escape into or are internally generated in vacuum space 24 of detector assembly 10. Getter 50 is of the type commonly referred to as a radio-frequency (RF) getter which can be activated ("fired") via RF induction heating as will be hereinafter described in greater detail. Getter 50 is concentrically disposed within dewar housing 14 so as to be in intimate contact with an inner wall surface 52 thereof. Getter 50 is positioned within dewar housing 14 prior to hermetically sealing window assembly 16 to circumferential flange portion 54 of dewar housing 14.

As is apparent from FIG. 1, inner wall surface 52 of dewar housing 14 has a tapered portion 56 adapted to accept receipt of a complimentary tapered outer surface 58 of getter 50. A generally cylindrical clamp member 60 engages an upper end surface of getter 50 and is secured, such as by welding, to dewar housing 14. Clamp member 62 includes a center aperture 61 through which coldfinger 22 extends for permitting getter 50 to communicate with vacuum space 24. In this manner, getter 50 can be readily positioned in a remote location displaced from the delicate and sensitive detector components and hermetic brazed and welded joints. As such, a greater volume of getter material can be positioned with detector assembly 10 to provide increased absorptive capacity for promoting increased vacuum shelf-life without impairing the mechanical and optical characteristics of detector 26.

RF getter 50 is shown to be preferably configured as an annular "washer-like" disk having a central aperture 59 concentrically surrounding the outer wall of coldfinger 22 in order to simplify the getter assembly process steps and to provide maximum getter material in a minimum space. It will be appreciated, that the configuration of getter 50 is merely exemplary in nature in that any configuration or positioning thereof within detector assembly 10 can be readily adapted to the present invention. Furthermore, utilization of RF getter 50 eliminates getter feedthrough pins associated with conventional "wire-heated" infrared detector assemblies thereby eliminating a primary source of premature detector failure. As such, longer vacuum life due to elimination of hermeticity failure at the getter feedthroughs results in greater reliability and lower manufacturing costs. Moreover, lower costs can be realized due to a reduction in the number of assembly operations, reduced vacuum failures at final assembly and inspection operations and lower getter procurement costs.

RF getter 50 can be made from a variety of materials which are conducive to electromagnetic inductive heating. For example, getter 50 can be made from metallic material specifically, a porous mixture of titanium and molybdenum powders, having a brand name of ST 175 which is manufactured by SAES Getters of Colorado Springs, Colo. This material has an activation or "firing" temperature of about 600–900° C. wherein sensitive detector components, braze joints, and welds can be kept below their maximum allowable temperature. Furthermore, placement of getter 50 in dewar housing 14 below sensitive IR detector elements eliminates direct line-of-sight heating on detector 26. As will be appreciated, other suitable materials can be likewise used for manufacturing RF getter 50.

With continued reference to FIG. 1, an improved method of assembling detector assembly 10 will now be described. Following bonding dewar housing 14 to mounting flange 18, getter 50 is "dropped" over coldfinger tube 22 and into vacuum assembly 12 with getter surface 58 restingly engaging tapered surface 56 of inner wall 52. Getter clamp 60 is thereafter aligned to engage an upper surface of getter 50 and is secured to inner vacuum tube wall 52 in a conventional manner. Thereafter, final dewar processing is completed which includes assembly of the detector components and closure welding of window assembly 16 to upper flange 54 of dewar housing 14 for producing a hermetic seal therebetween. Next, vacuum space 24 is evacuated through tip-off tube 64 to produce the vacuum environment within detector assembly 10. Following evacuation of vacuum space 24, getter 50 is "fired" as will be hereinafter described for activating getter 50 to absorb residual out-gases.

According to the present invention, a method for "firing" or activating RF getter 50 installed within metallic dewar housing 14 of detector assembly 10 will now be described in greater detail. Following final vacuum bake at the highest temperature allowable, getter 50 is activated via electromagnetic induction heating. As is known, induction heating is possible with any electrically conductive material. As alternating current flows through a work coil, a highly concentrated and rapid alternating magnetic field is established within the coil. The magnetic field "induces" an electric potential in the metallic workpiece such that the induced voltage causes the flow of current. Resistance of the workpiece to the flow of induced current causes heating by $I^2R$ losses. As in any electromagnetic induction heating system, the heating pattern is determined by the shape of the coil, the number of turns in the coil, the operating frequency and the alternating current power input.

Figure 2:
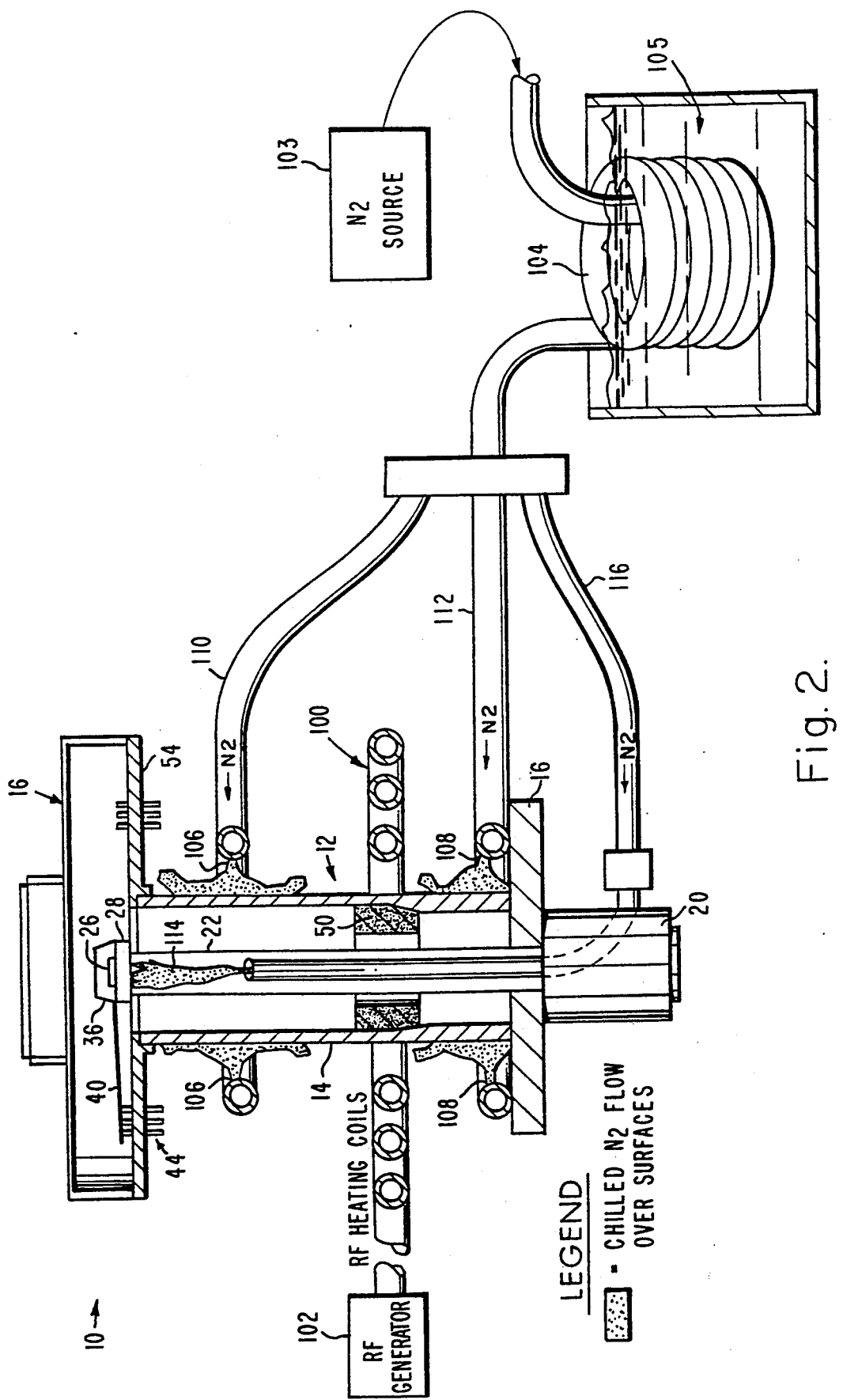
FIG. 2 illustrates the RF getter activation or "firing" process associated with the detector assembly of FIG. 1.

As shown in FIG. 2, an electromagnetic work coil 100 is placed concentrically about an outer peripheral surface 102 of dewar housing 14 adjacent the location of getter 50 therein. A power supply such as RF generator 102 is provided to generate the magnetic field within work coil 100 for heating getter 50 via inductive and conductive heating through metallic dewar housing 14. For example, RF generator operating at 450 kHz and 2.5 kw is capable of heating getter 50 through dewar housing 14 to an activation temperature of approximately 700° C.

Concurrent with the RF induction activation heating, means are provided for cooling various areas adjacent to getter 50 for thermally isolating the surface areas generally adjacent the portion of dewar housing 14 being heated by coil 100. Chilled gaseous $N_2$ shown flowing through a coil 104 immersed in a bath 105 of chilled liquid $N_2$ is provided for cooling the surface area of dewar housing 14 above and below getter 50 to avoid overheating. The chilled gaseous $N_2$ is pumped from a remote source 103 through coil 104. As shown, the gaseous $N_2$ is discharged through a series of peripheral orifices 106 and 108 in upper and lower cooling coils 110 and 112, respectively, onto the outer surface 102 of dewar housing 14 at locations above and below getter 50. In addition, a jet 114 of chilled gaseous $N_2$ is discharged from a third coil 116 extending upwardly through coldfinger 22 onto the backside of focal plane 28 for cooling detector 26 during the "firing" process. In this manner, detector 26 and hermetically brazed joints and weld seams are cooled so as to be kept below their maximum allowable temperatures. It will be appreciated that other suitable cooling fluids, media or thermally conductive materials can be readily used for cooling the areas surrounding getter 50 and detector 26 during getter activation processing. As is apparent, getter activation is relatively simple and does not necessitate highly sophisticated or technical processing or equipment.

Those skilled in the art can now appreciated that the present invention provides a novel, yet economical and reliable dewar package construction which eliminates many of the drawbacks associated with traditional evacuated dewars. It is to be understood that while this invention was described in connection with one particular example, many modifications can be made thereto without departing from the spirit of this invention after having the benefit of studying the specification, drawings and following claims.

What is claimed is:

1. An infrared detector assembly comprising:
 a metallic dewar housing providing an evacuated chamber;
 an infrared detector supported within said evacuated chamber;
 cooling means for cooling said infrared detector during operation of said detector assembly;
 getter means provided in said evacuated chamber for gettering gas molecules therefrom, said getter means located remotely from said infrared detector;
 means for fixedly securing said getter means within said dewar housing; and
 wherein said getter means is adapted for activation via electromagnetic induction heating through said metallic dewar housing.

2. The infrared detector assembly of claim 1 wherein said cooling means is a cryogenic cooling system operable to cool said infrared detector.

3. The infrared detector assembly of claim 1 further comprising a coldfinger tube within said dewar housing having a cold end adapted to support said infrared detector thereon, said cooling means operable to withdraw heat into said coldfinger from said detector through said cold end.

4. The infrared detector assembly of claim 3 wherein said getter means is located intermediate said coldfinger tube and said dewar housing below said infrared detector for inhibiting line-of-sight interference of incoming infrared radiation directed at said detector.

5. The infrared detector assembly of claim 4 wherein said getter is configured as an annular ring having an outer peripheral surface intimately engaging an inner peripheral surface of said dewar housing and wherein said getter means is fabricated from a metallic material capable of being heat activated through intimate surface engagement with said dewar housing when said dewar housing is heated.

6. The infrared detector assembly of claim 5 wherein said getter material has an activation temperature in a range between about 600–900° C.

7. The infrared detector assembly of claim 5 wherein said outer peripheral surface of said getter means is tapered for matingly engaging a complimentary tapered surface formed on said inner peripheral surface of said dewar housing, and wherein said means for fixedly securing said getter means within said dewar housing comprises a clamp means acting on said getter means for maintaining said getter means in engagement with said tapered surface, said clamp means being fixedly secured to said dewar housing within said evacuated chamber.

8. The infrared detector assembly of claim 4 wherein said getter means is configured as an annular ring and is fabricated from a metallic material capable of being heat activated by RF induction.

9. The infrared detector assembly of claim 8 wherein said annular ring has an outer peripheral surface intimately engaging an inner peripheral surface of said dewar housing.

10. The infrared detector assembly of claim 9 wherein said outer peripheral surface of said getter mean is tapered for matingly engaging a complimentary tapered surface formed on said inner peripheral surface of said dewar housing, and wherein said means for fixedly securing said getter means within said dewar housing comprises a clamp means acting on said getter means for maintaining said getter means in engagement with said tapered surface, said clamp means being fixedly secured to said dewar housing within said evacuated chamber.

11. A method of assembling a getter into an infrared detector assembly of the type having a coldfinger supporting a detector within a chamber of a metallic dewar housing, said method comprising the steps of:
    providing a getter made of material capable of being heat activated via electromagnetic induction heating;
    positioning said getter within said dewar housing remote from said infrared detector and in contact with a portion of an inner wall surface of said metallic dewar housing;
    fixedly securing said getter relative to said dewar housing and said infrared detector;
    electrically interconnecting said infrared detector to a connector; and
    sealing a window assembly to said dewar housing for creating a hermetic seal therebetween.

12. The method of claim 11 further comprising the steps of:
    evacuating said chamber to define a vacuum environment in the area generally surrounding said infrared detector and said getter,
    activating said getter by heating said getter to its activation temperature utilizing induction heating means for heating said metallic dewar housing adjacent said getter; and
    cooling portions of said dewar housing in close proximity to said getter for thermally isolating said infrared detector from heat generated by said induction heating means.

13. The method of claim 12 wherein said getter forms an annular ring positioning concentrically between said coldfinger and said metallic dewar housing, said annular ring having an outer peripheral wall contacting said inner wall surface of said metallic dewar housing.

14. A method of activating getter material disposed within an evacuated chamber of a metallic dewar housing for an infrared detector assembly, said infrared detector supported on a coldfinger located within said evacuated chamber with an annular space within said chamber located between said coldfinger and an inner wall surface of said metallic dewar, said method comprising the steps of:
    forming said getter material into a ring-shaped getter of a metallic getter material;
    placing said ring-shaped getter into said annular space displaced from said detector and close to said metallic dewar housing;
    placing an electromagnetic induction coil coaxially around an outer peripheral portion of said metallic dewar housing in close proximity to said getter;
    positioning cooling means adjacent said dewar housing on opposite sides of said induction coil for thermally isolating the remainder of said detector assembly therefrom;
    inductively heating said metallic dewar housing upon application of power to said induction coil such that heat is inductively and/or conductively transferred to said getter for heating said getter to a desired activation temperature within said evacuated chamber; and
    cooling the remainder of said dewar housing via said cooling means concurrently upon heating said getter.

15. The getter material activation method of claim 14 further comprising the step of positioning second cooling means within said coldfinger for directly cooling said infrared detector during heating of said getter.

16. A getter material activation method as in claim 14 wherein said ring-shaped getter is placed into said annular space in contact with said inner wall surface of said metallic dewar.

* * * * *